(12) United States Patent
Kim

(10) Patent No.: US 6,825,124 B2
(45) Date of Patent: Nov. 30, 2004

(54) METHOD OF FORMING METAL LINE IN SEMICONDUCTOR DEVICE

(75) Inventor: Dong Joon Kim, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/636,168

(22) Filed: Aug. 7, 2003

(65) Prior Publication Data

US 2004/0127002 A1 Jul. 1, 2004

(30) Foreign Application Priority Data

Dec. 27, 2002 (KR) .................................. 10-2002-0085499

(51) Int. Cl.⁷ .......................................... H01L 21/311
(52) U.S. Cl. ........................ 438/700; 438/475; 438/905
(58) Field of Search ........................... 438/700, 471, 438/474, 475, 680, 681, 679, 687, 675, 715, 732, 733, 740, 706, 905, 906, 697, 692, 704

(56) References Cited

U.S. PATENT DOCUMENTS

| | | | | |
|---|---|---|---|---|
| 5,143,820 A | * | 9/1992 | Kotecha et al. | 430/314 |
| 5,935,762 A | * | 8/1999 | Dai et al. | 430/312 |
| 5,997,757 A | * | 12/1999 | Nagayama et al. | 216/38 |
| 6,057,247 A | * | 5/2000 | Imai et al. | 438/714 |
| 6,126,806 A | | 10/2000 | Uzoh | |
| 6,235,406 B1 | | 5/2001 | Uzoh | |
| 6,355,571 B1 | * | 3/2002 | Huang et al. | 438/706 |
| 6,380,096 B2 | * | 4/2002 | Hung et al. | 438/723 |

* cited by examiner

Primary Examiner—David Nhu
(74) Attorney, Agent, or Firm—Marshall, Gerstein & Borun LLP

(57) ABSTRACT

Disclosed is a method of forming the metal line in the semiconductor device. The method comprising the steps of forming an interlay insulating film on a semiconductor substrate in which a lower line is formed, patterning the interlay insulating film to form an aperture unit for forming an upper line connected to the lower line, cooling the semiconductor substrate in which the aperture unit is formed at a given temperature, implementing a cleaning process using a hydrogen reduction reaction in order to remove polymer formed on the sidewall of the aperture unit and a metal oxide film formed on the lower line, implementing an annealing process in-situ within a chamber in which the cleaning process is implemented, and burying the aperture unit with a conductive material to form an upper line.

11 Claims, 3 Drawing Sheets

METHOD OF FORMING METAL LINE IN SEMICONDUCTOR DEVICE

BACKGROUND OF THE INVENTION

1. Field of the Invention

The present invention relates to a method of fabricating semiconductor devices, and more particularly, to a method of forming a metal line in the semiconductor device which can minimize carbon loss in a low dielectric interlayer insulating film by implementing a hydrogen reactive cleaning process at low temperature and remove residua generated in a reduction reaction of a copper oxide film by in-situ implementing an annealing process within a chamber in which the hydrogen reactive cleaning process is implemented, whereby an interfacial characteristic of the low dielectric interlay insulating film is improved.

2. Background of the Related Art

As micro-process, a rapid operating speed and a high reliability are required, copper (Cu) is used as a metal line of the semiconductor device. In general, the copper line is formed using a dual damascene pattern by means of an electroplating method. After the copper film is formed by the electroplating method, an annealing process is implemented at a given temperature before a chemical mechanical polishing (CMP) process for the purpose of property stabilization.

Meanwhile, a physical method using sputter etch has been usually used in a cleaning process for a contact that opens a lower copper line. Due to this, there is a problem that Cu redeposition within the contact occurs. However, as a low dielectric film that is not dense is used as an interlay insulating film for the purpose of a high speed of the device, there is a need for a new technology for the cleaning. Research has recently been made on a reactive cleaning process using hydrogen reduction. However, the reactive cleaning process using hydrogen reduction has a problem that it causes surface damage in the low dielectric interlay insulating film containing carbon to degrade the dielectric characteristic of the interlay insulating film. In other words, as a reduction reaction of the copper oxide film on the surface of the copper film being the lower line, i.e., a Cu—O+H$^+$→Cu+OH (or H$_2$O) reaction occurs, residua such as OH radicals or H$_2$O are created. Also, as SiOC+H$^+$→Si—O+CH$_4$ reaction occurs at the sidewall of a contact hole formed within the interlay insulating film, carbon loss is caused. The low dielectric interlay insulating film of such carbon series is damaged by hydrogen. It was known that this phenomenon is severe when the processing temperature of the reactive cleaning process is high. Therefore, this problem must be solved from the viewpoint of reliability of the semiconductor.

SUMMARY OF THE INVENTION

Accordingly, the present invention is contrived to substantially obviate one or more problems due to limitations and disadvantages of the related art, and an object of the present invention is to provide a method of forming a metal line in a semiconductor device which can minimize carbon loss in a low dielectric interlayer insulating film by implementing a hydrogen reactive cleaning process at low temperature and remove residua generated in a reduction reaction of a copper oxide film by in-situ implementing the annealing process within a chamber in which the hydrogen reactive cleaning process is implemented, whereby an interfacial characteristic of the low dielectric interlay insulating film is improved.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a metal line in a semiconductor device according to the present invention is characterized in that it comprises the steps of forming an interlay insulating film on a semiconductor substrate in which a lower line is formed, patterning the interlay insulating film to form an aperture unit for forming an upper line connected to the lower line, cooling the semiconductor substrate in which the aperture unit is formed at a given temperature, implementing a cleaning process using a hydrogen reduction reaction in order to remove polymer formed on the sidewall of the aperture unit and a metal oxide film formed on the lower line, implementing an annealing process in-situ within a chamber in which the cleaning process is implemented, and burying the aperture unit with a conductive material to form an upper line.

The aperture unit may be a contact hole, a trench, a single damascene pattern, or a dual damascene pattern consisting of a via hole and a trench.

It is preferred that the cleaning process is implemented using H$_2$ gas and Ar gas or H$_2$ gas, Ar gas and N$_2$ gas at a low temperature of about 25° C.~50° C. The cleaning process may be implemented by implanting H$_2$ gas of 2~15 sccm and Ar gas of 4~30 sccm at a pressure of 1.5~3 mT, a source power of 500~750 W and a bias power of 0~100 W, or implanting H$_2$ gas of 2~15 sccm, N$_2$ gas of 2~15 sccm and Ar gas of 4~30 sccm at a pressure of 1.5~3 mT, a source power of 500~750 W and a bias power of 0~100 W.

The annealing process is implemented in two steps, wherein the first step is implemented at a relatively low temperature of blow 100° C.~150° C. in order to mitigate stress and detach the residua such as OH radicals or H$_2$O absorbed on the sidewall of the aperture unit, and the second step is implemented at a relatively high temperature of about 300° C.~400° C. in order to accomplish densification of the interlay insulating film and the lower line.

The interlay insulating film may be an insulating film of SiOC series having a low dielectric constant.

The lower line may include a copper film.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
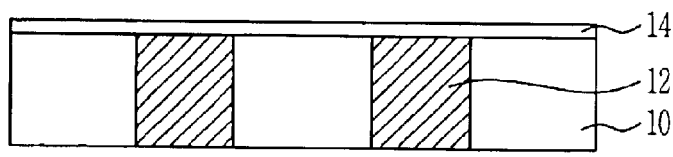
FIG. 1~FIG. 7 are cross-sectional views of semiconductor devices for explaining a method of forming a metal line in the device according to a preferred embodiment of the present invention.

Reference will now be made in detail to the preferred embodiments of the present invention, examples of which are illustrated in the accompanying drawings, in which like reference numerals are used to identify the same or similar parts.

FIG. 1~FIG. 7 are cross-sectional views of semiconductor devices for explaining a method of forming a metal line in the device according to a preferred embodiment of the present invention.

Referring to FIG. 1, a semiconductor substrate 10 in which a semiconductor device including a transistor (not shown), etc. is formed and lower lines 12 using a single damascene process are formed, is prepared. A capping film 14 for preventing diffusion of a metal is then formed on the semiconductor substrate 10 in which the lower lines 12 are formed. The lower line 12 is formed using copper (Cu) and the capping film 14 is formed using a nitride film. The capping film 14 is formed in thickness of about 500 Å.

Figure 2:
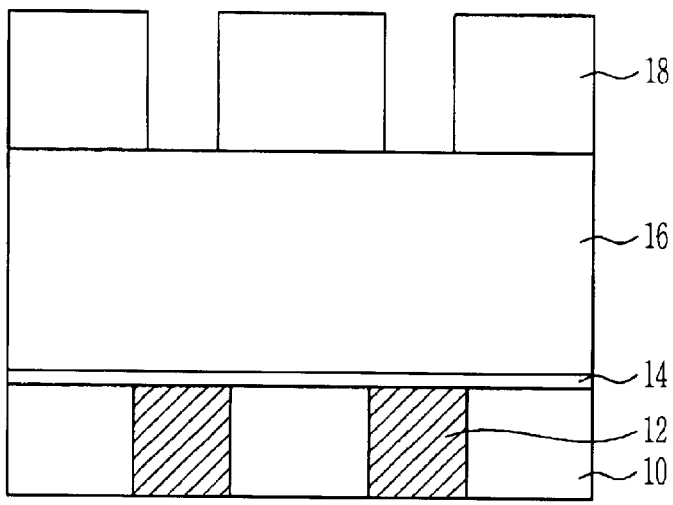

By reference to FIG. 2, an interlay insulating film 16 is formed on the capping film 14. The interlay insulating film 16 is formed using an insulating film of SiOC series, an insulating film of SiOH, an insulating film of SiOF series, a porous silica insulating film, or the like, which has a low dielectric constant. The SiOC film has a shape in which a large amount of carbon is doped in a gage structure having silicon and oxygen. The interlay insulating film 16 is formed in thickness of about 4000 Å~5000 Å.

A first photoresist film patterns 18 that defines a via hole (20 in FIG. 3) is formed on the interlay insulating film 16.

Figure 3:
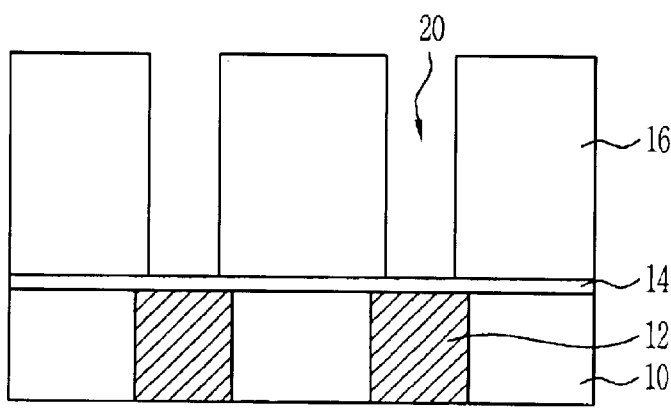

With reference to FIG. 3, the interlay insulating film 16 is etched using the first photoresist film pattern 18 as an etch mask, thus forming the via hole 20. Etch for forming the via hole 20 is implemented to have an etch selectivity ratio having a high etch speed for the interlay insulating film 16 than the capping film 14. Etch for forming the via hole 20 may be implemented using $C_4F_8$ or $C_5F_8$ gas and $N_2$ gas and Ar gas. In the concrete, for example, the etch process may be performed by implanting $C_4F_8$ or $C_5F_8$ gas of 3~8 sccm, $N_2$ gas of 100~200 sccm and Ar gas of 400~800 sccm at a pressure of 50~80 mT, a source power of 1200~1500 W and a bias power of 1500~1800 W.

Figure 4:
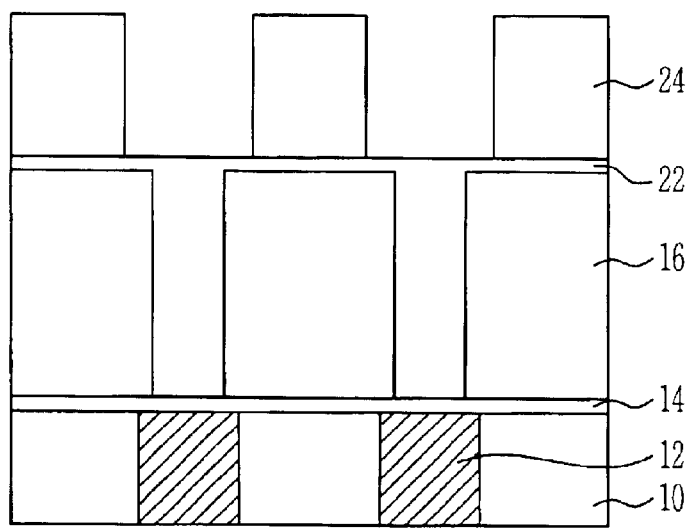

Turning to FIG. 4, an organic bottom anti-reflective coating 22 is coated using a rotation coating method, thus burying the via hole 20. A second photoresist film pattern 24 defining the trench (26 in FIG. 5) is then formed on the semiconductor substrate 10.

Figure 5:
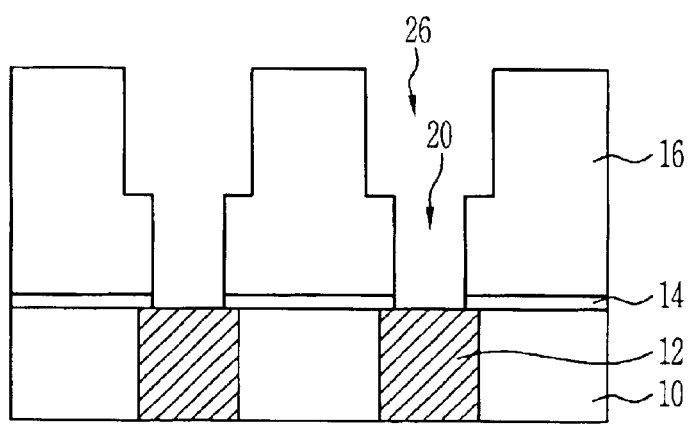

Referring to FIG. 5, a part of the interlay insulating film 16 is etched using the second photoresist film pattern 24 as an etch mask, thus forming a trench 26. In the concrete, for example, after the anti-reflective film is removed using $O_2$ plasma, a part of the interlay insulating film 16 is etched using plasma in which $C_4F_8$ gas, $N_2$ gas or Ar gas are activated, thereby forming the trench 26. The second photoresist film pattern 24 and the anti-reflective film remaining on the interlayer insulating film 16 are removed. The capping film 14 exposed through the via hole 20 for connection to the lower line 12 is removed to form a dual damascene pattern.

Figure 6:
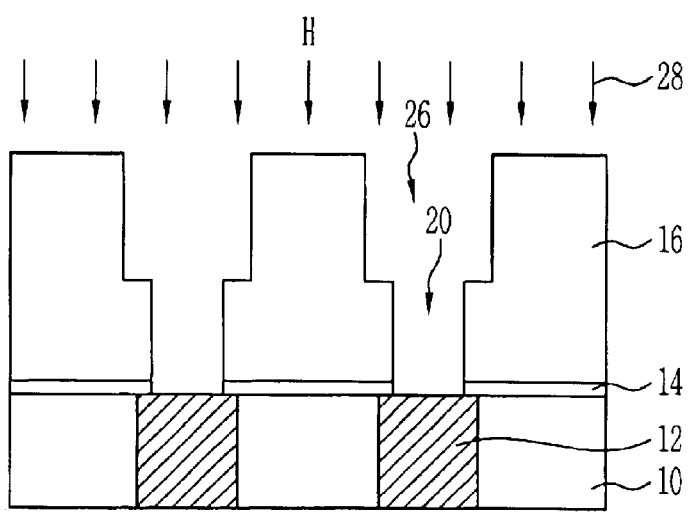

By reference to FIG. 6, the gas used to form the trench 26 or the gas used to remove the second photoresist film pattern 24 are purged or exhausted from the chamber. The semiconductor substrate 10 is slowly cooled up to 100° C. at a rate of 10~50° C./min. It is preferred that the semiconductor substrate 10 is slowly cooled in order to reduce a thermal shock of the wafer depending on an abrupt cooling of the wafer. In general, as a subsequent cleaning process 28 is in-situ implemented within the chamber used to form the trench 26, the wafer includes a latent heat of the degas process (process for purging or exhausting the gas) and may be thus experienced by thermal damage. Accordingly, thermal damage could be minimized by implementing the mentioned cooling process before the cleaning process.

A hydrogen reactive cleaning process 28 is implemented in order to remove polymer that may occur in the above etch processes and the copper oxide film formed on the lower line 12. It is preferred that the cleaning process 28 utilizes $H_2$ gas and Ar gas, or $H_2$ gas, Ar gas and $N_2$ gas. At this time, it is preferred that the ratio of the $H_2$ gas and the Ar gas (or Ar gas and $N_2$ gas) is controlled not to exceed 0.5. Furthermore, it is preferred that the cleaning process 28 is implemented at low temperature of about 25° C.~50° C. in order to minimize degradation of the low dielectric interlay insulating film 16. In the concrete, for example, the cleaning process 28 may be implemented by implanting $H_2$ gas of 2~15 sccm and Ar gas of 4~30 sccm at a pressure of 1.5~3 mT, a source power of 500~750 W and a bias power of 0~100 W, or implanting $H_2$ gas of 2~15 sccm, $N_2$ gas of 2~15 sccm and Ar gas of 4~30 sccm at a pressure of 1.5~3 mT, a source power of 500~750 W and a bias power of 0~100 W.

After the cleaning process is performed, an annealing process is implemented in order to remove OH radicals or residua such as $H_2O$ adsorbed on the sidewall of the dual damascene pattern and hydrogen contained within the interlay insulating film 16. The annealing process is implemented in two steps; the first step is implemented at a relatively low temperature of blow 100° C.~150° C. in order to mitigate stress and detach the residua such as OH radicals or $H_2O$ without a chemical reaction with the interlay insulating film 16, and the second step is implemented at a relatively high temperature of about 300° C.~400° C. in order to accomplish densification of the interlay insulating film 16 and the lower line 12. Furthermore, it is preferred that the annealing process is in-situ implemented within the chamber in which the cleaning process is implemented.

Figure 7:
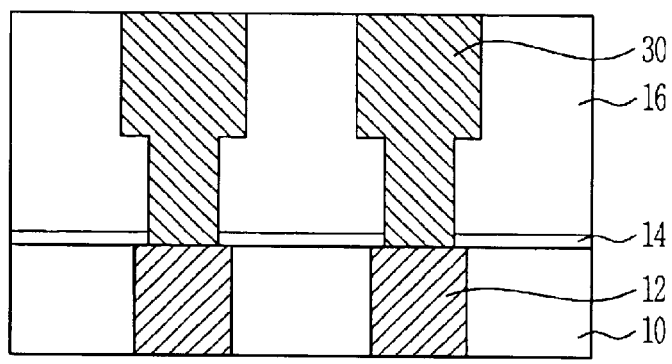

Turning to FIG. 7, a barrier film (not shown) for preventing diffusion of copper (Cu) is deposited on the semiconductor substrate 10 in which the dual damascene pattern consisting of the via hole 20 and the trench 26 is formed, along the step. After a copper seed layer (not shown) is deposited on the barrier layer, an upper line 30 is formed by means of an electroplating method. Next, an annealing process and a polishing process using chemical mechanical polishing (CMP) are implemented to a metal line of a dual damascene structure.

In the above embodiment, a case where after the dual damascene pattern having the via hole 20 and the trench 26 is formed within the interlay insulating film 16, the hydrogen reactive cleaning process is implemented, has been described as an example. However, those having an ordinary skill in the art will appreciate that the present invention could be applied to a case where after a contact hole, the trench 26 or the single damascene pattern is formed within the interlay insulating film 16, the cleaning process is implemented.

As described above, the present invention has new effect that it can reduce degradation of the low dielectric interlay insulating film since the reactive cleaning process is implemented at low temperature.

Also, an influence of a latent heat remaining in the wafer after the degas process could be excluded by implementing a cooling process before the reactive cleaning process. Therefore, the present invention has a new effect that it can improve instability of the process (variation between the wafer and the wafer) as well as degradation of the interlay insulating film.

Furthermore, the annealing process is in-situ implemented after the reactive cleaning process. Due to this, the residua could be detached, the interlay insulating film and the damaged copper film could be densified. Accordingly, the present invention has an outstanding effect that it can improve an electrical characteristic of the semiconductor device.

In addition, in a prior art, a physical method using a sputter is used as the contact cleaning process. For this reason, there was a problem that Cu redeposition within the contact occurs. In the present invention, however, a reactive cleaning process using hydrogen reduction at low temperature is employed. Therefore, the present invention has new effects that it can minimize degradation of the low dielectric interlay insulating film and obviate such problem as Cu redeposition.

Incidentally, the reactive cleaning process is implemented at low temperature. Accordingly, the present invention has outstanding advantages that it can improve the step coverage for the dual damascene pattern and a gap fill characteristic accordingly.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming a metal line in a semiconductor device, comprising the steps of:

forming an interlay insulating film on a semiconductor substrate in which a lower line is formed;

patterning the interlay insulating film to form an aperture unit for forming an upper line connected to the lower line;

cooling the semiconductor substrate in which the aperture unit is formed at a given temperature;

implementing a cleaning process using a hydrogen reduction reaction in order to remove polymer formed on a sidewall of the aperture unit and a metal oxide film formed on the lower line, wherein the cleaning process is implemented at a temperature of about 25° C.–50° C. to minimize degradation of the interlay insulating film;

implementing an annealing process in-situ within a chamber in which the cleaning process is implemented, wherein the annealing process is implemented in two steps, the first step implemented to mitigate stress and detach OH radicals or $H_2O$ residue absorbed on the sidewall of the aperture unit, and the second step implemented at a temperature higher than that of the first step to accomplish densification of the interlay insulating film and the lower line; and burying the aperture unit with a conductive material to form an upper line.

2. The method as claimed in claim 1, wherein the aperture unit is a contact hole, a trench, a single damascene pattern, or a dual damascene pattern consisting of a via hole and a trench.

3. The method as claimed in claim 1, wherein, the cleaning process is implemented using $H_2$ gas and Ar gas or $H_2$ gas, Ar gas and $N_2$ gas.

4. The method as claimed in claim 1, wherein the cleaning process is implemented by implanting $H_2$ gas of 2–15 sccm and Ar gas of 4–30 sccm at a pressure of 1.5–3 mT, a source power of 500–750 W and a bias power of 0–100 W, or implanting $H_2$ gas of 2–15 sccm, $N_2$ gas of 2–15 sccm and Ar gas of 4–30 sccm at a pressure of 1.5–3 mT, a source power of 500–750 W and a bias power of 0–100 W.

5. The method as claimed in claim 1, wherein the first step is implemented at a relatively low temperature of below 100° C.–150° C. in order to mitigate stress and detach OH radicals or $H_2O$ residua absorbed on the sidewall of the aperture unit, and the second step is implemented at a relatively high temperature of about 300° C.–400° C. in order to accomplish densification of the interlay insulating film and the lower line.

6. The method as claimed in claim 1, wherein the interlay insulating film Is an insulating film of SiOC series having a low dielectric constant.

7. The method as claimed in claim 1, wherein the lower line is a copper film.

8. The method as claimed in claim 1, wherein the cooling process is slowly implemented at a rate of 10–50° C./min.

9. The method as claimed in claim 1, wherein the step of forming the aperture unit comprises:

etching the interlay insulating film to form a via hole;

burying the via hole with an anti-reflective film; and etching a part of the interlay insulating film to form a trench having an aperture unit wider than the via hole and exposing the lower line through the via hole.

10. The method as claimed in claim 9, wherein the step of forming the trench and the step of implementing the cleaning process are in-situ implemented.

11. The method as claimed in claim 1, wherein the step of forming the upper line comprises:

depositing a barrier film along the step of the semiconductor substrate in which the aperture unit is formed;

depositing a metal seed layer on the barrier film;

forming a metal film on the metal seed layer using an electroplating method, thus burying the aperture unit; and polishing the metal film to form an upper line.

* * * * *

UNITED STATES PATENT AND TRADEMARK OFFICE
CERTIFICATE OF CORRECTION

PATENT NO. : 6,825,124 B2
DATED : November 30, 2004
INVENTOR(S) : Dong J. Kim

It is certified that error appears in the above-identified patent and that said Letters Patent is hereby corrected as shown below:

Column 6,
Line 31, after "insulating film" please delete "Is" and insert -- is -- in its place.

Signed and Sealed this

Seventeenth Day of May, 2005

JON W. DUDAS
*Director of the United States Patent and Trademark Office*